US009590067B2

(12) United States Patent
MacMillan

(10) Patent No.: US 9,590,067 B2
(45) Date of Patent: Mar. 7, 2017

(54) SILICON CARBIDE SEMICONDUCTOR DEVICES HAVING NITROGEN-DOPED INTERFACE

(71) Applicant: Global Power Device Company, Lake Forest, CA (US)

(72) Inventor: Michael MacMillan, Rancho Santa Margarita, CA (US)

(73) Assignee: Global Power Technologies Group, Inc., Lake Forest, CA (US)

( * ) Notice: Subject to any disclaimer, the term of this patent is extended or adjusted under 35 U.S.C. 154(b) by 0 days.

(21) Appl. No.: 14/133,507

(22) Filed: Dec. 18, 2013

(65) Prior Publication Data

US 2014/0167073 A1    Jun. 19, 2014

Related U.S. Application Data

(60) Provisional application No. 61/738,943, filed on Dec. 18, 2012.

(51) Int. Cl.
| | |
|---|---|
| H01L 29/24 | (2006.01) |
| H01L 29/51 | (2006.01) |
| H01L 29/739 | (2006.01) |
| H01L 29/78 | (2006.01) |
| H01L 29/161 | (2006.01) |
| H01L 21/20 | (2006.01) |
| H01L 29/16 | (2006.01) |
| H01L 29/66 | (2006.01) |
| H01L 21/04 | (2006.01) |

(52) U.S. Cl.
CPC .......... *H01L 29/518* (2013.01); *H01L 21/045* (2013.01); *H01L 21/049* (2013.01); *H01L 29/1608* (2013.01); *H01L 29/513* (2013.01); *H01L 29/66068* (2013.01); *H01L 29/7802* (2013.01); *H01L 29/7828* (2013.01)

(58) Field of Classification Search
CPC ..... H01L 29/36; H01L 29/1608; H01L 29/45; H01L 29/518
USPC ............................ 257/77, 287; 438/268, 478
See application file for complete search history.

(56) References Cited

U.S. PATENT DOCUMENTS

| | | | |
|---|---|---|---|
| 2006/0220026 A1* | 10/2006 | Uchida et al. | 257/77 |
| 2010/0230745 A1* | 9/2010 | Saito et al. | 257/329 |
| 2011/0180813 A1* | 7/2011 | Harada et al. | 257/77 |
| 2012/0139623 A1* | 6/2012 | Hashimoto et al. | 327/537 |

(Continued)

OTHER PUBLICATIONS

Radtke et al., Initial stages of SiC oxidation investigated by ion scattering and angle-resolved x-ray photoelectron spectroscopies, Appl. Phy. Lett., 78(23):3601-3603, 2001.

*Primary Examiner* — Kimberly Rizkallah
*Assistant Examiner* — Brian Turner
(74) *Attorney, Agent, or Firm* — Perkins Coie LLP

(57) ABSTRACT

Methods, systems, and devices are disclosed for implementing high power circuits and semiconductor devices. In one aspect, a method for fabricating a silicon carbide semiconductor device includes forming a thin epitaxial layer of a nitrogen doped SiC material on a SiC epitaxial layer formed on a SiC substrate, and thermally growing an oxide layer to form an insulator material on the nitrogen doped SiC epitaxial layer, in which the thermally grown oxide layer results in at least partially consuming the nitrogen doped SiC epitaxial layer in the oxide layer to produce an interface including nitrogen between the SiC epitaxial layer and the oxide layer.

19 Claims, 5 Drawing Sheets

(56) References Cited

U.S. PATENT DOCUMENTS

2012/0235165 A1\* 9/2012 Harada et al. .................. 257/77

\* cited by examiner

SILICON CARBIDE SEMICONDUCTOR DEVICES HAVING NITROGEN-DOPED INTERFACE

CROSS REFERENCE TO RELATED APPLICATIONS

This patent document claims the benefit of U.S. Provisional Patent Application No. 61/738,943, filed on Dec. 18, 2012, entitled "SILICON CARBIDE SEMICONDUCTOR DEVICES HAVING NITROGEN-DOPED INTERFACE." The entire content of the before-mentioned patent application is incorporated by reference as part of the disclosure of this document.

TECHNICAL FIELD

This patent document relates to semiconductor technologies.

BACKGROUND

Silicon carbide (SiC) semiconductor materials can exist of various crystalline forms and can be used to construct various SiC based circuits and devices. In comparison with the commonly used silicon, SiC materials possess properties such as a wide bandgap structure and higher breakdown field. These properties make SiC materials attractive for a wide range of circuits and applications including high power electronics.

A field-effect transistor (FET) is a transistor that uses an electric field to control the shape and in turn the conductivity of a channel of one type of charge carrier in a semiconductor material. FETs are unipolar transistors that involve single-carrier-type operation. FETs can be structured to include an active channel through which majority charge carriers, e.g., such as electrons or holes, flow from a source to a drain. The main terminals of a FET include a source, through which the majority carriers enter the channel; a drain, through which the majority carriers leave the channel; and a gate, the terminal that modulates the channel conductivity. For example, source and drain terminal conductors can be connected to the semiconductor through ohmic contacts. The channel conductivity is a function of the potential applied across the gate and source terminals.

SUMMARY

Techniques, systems, and devices are disclosed for implementing high power circuits and semiconductor devices on SiC materials with nitrogen incorporated at a $SiO_2$/SiC interface through epitaxial growth of a highly nitrogen doped top epitaxial layer.

In one aspect of the disclosed technology, a method for fabricating a silicon carbide semiconductor device includes forming a thin epitaxial layer of a nitrogen doped SiC material on a SiC epitaxial layer formed on a SiC substrate, and thermally growing an oxide layer to form an insulator material on the nitrogen doped SiC epitaxial layer, in which the thermally growing the oxide layer results in at least partially consuming the nitrogen doped SiC epitaxial layer in the oxide layer to produce an interface including nitrogen between the SiC epitaxial layer and the oxide layer.

In another aspect, a SiC device is disclosed to include a SiC substrate; a SiC epitaxial layer formed on the SiC substrate; an oxide layer of an insulator material formed on the SiC epitaxial layer, the oxide layer including a surface layer including nitrogen that forms an interface with the SiC epitaxial layer; and one or more transistor structures over the oxide layer.

In another aspect, a SiC device is disclosed to include a SiC substrate; a SiC epitaxial layer formed on the SiC substrate; an oxide layer of an insulator material formed on the SiC epitaxial layer, the oxide layer including a surface layer including nitrogen that forms an interface with the SiC epitaxial layer; a residual layer formed of a nitrogen doped SiC epitaxial layer between the SiC epitaxial layer and the surface layer of the oxide layer; and one or more transistor structures over the oxide layer.

In another aspect, a method is provided for forming a transistor over a SiC substrate and includes forming a SiC epitaxial layer over a SiC substrate; forming a source region and a gate region over the SiC epitaxial layer; forming a thin epitaxial layer of a nitrogen doped SiC material on over the gate region over the SiC epitaxial layer; growing an oxide layer to form an insulator material on the nitrogen doped SiC epitaxial layer to form an interface that includes nitrogen between the SiC epitaxial layer and the oxide layer without performing post oxidation gas annealing; and forming a source conductive contact over the source region and a gate conductive contact over the gate region as part of a transistor.

In yet another aspect, a method for fabricating a silicon carbide (SiC) device is disclosed to include forming a thin epitaxial layer of a nitrogen doped SiC material on a SiC epitaxial layer formed on a SiC substrate; thermally growing an oxide layer to form an insulator material on the nitrogen doped SiC epitaxial layer; and controlling the thermally growing the oxide layer to cause the nitrogen doped SiC epitaxial layer in the oxide layer to be at least partially consumed to produce an interface including nitrogen between the SiC epitaxial layer and the oxide layer.

Those and other aspects, implementations and associated features are described in greater in detail in the drawings, the description and claims.

BRIEF DESCRIPTION OF THE DRAWINGS

Like reference symbols and designations in the various drawings indicate like elements.

DETAILED DESCRIPTION

Techniques, systems, and devices are disclosed for implementing high power circuits and semiconductor devices based on SiC materials with nitrogen incorporated at a $SiO_2$/SiC interface through epitaxial growth of a highly nitrogen doped top epitaxial layer.

Silicon carbide can be used as a semiconductor material for fabricating power electronic devices, e.g., such as field effect transistors used in power control applications, including high power circuits. Fabrication of such field effect transistors can include creating an insulator on a silicon carbide (SiC) substrate. For example, in the case of a silicon dioxide (SiO$_2$) insulator material on the SiC substrate, a disturbed interface exists between the SiO$_2$ and the SiC due to the changed surface stoichiometry, which can result in a surface roughness that have negative effects on the performance of the device. For example, a layer of SiO$_2$ insulator material can be grown on the SiC material at high temperature (e.g., within a range 900° C. to 1200° C.) in an oxidizing environment, e.g., including, but not limited to, dry oxygen, wet oxygen, steam, nitrous oxide (N$_2$O), nitric oxide (NO), among other oxygenated environments. For example, such a process of creating an insulator like SiO$_2$ can often lead to a complex interface and a non-stoichiometric surface of SiC, e.g., which can result in low carrier mobility at the SiO$_2$/SiC interface.

Figure 1:
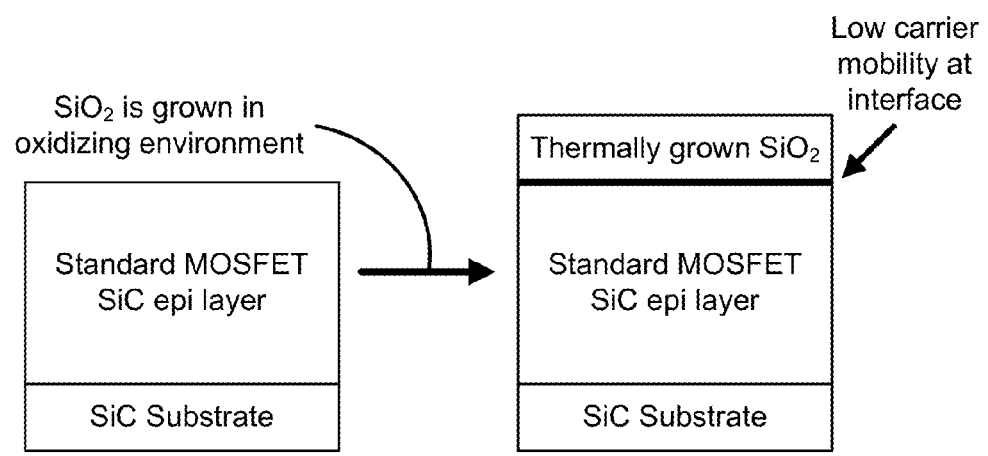
FIG. 1 shows a processing diagram of a device including a silicon dioxide layer grown on a silicon carbide substrate.

FIG. 1 shows a processing diagram of a device including a SiO$_2$ layer grown on a SiC substrate, in which the interface between the SiO$_2$ layer and the SiC substrate forms a disturbed layer (e.g., having a non-stoichiometry and increased roughness). The performance of an exemplary field effect transistor is very sensitive to the quality of the of the SiO$_2$/SiC interface.

For example, a disturbed/rough interface formed between the SiC and a silicon oxide/insulator layer can give rise to a number of undesired results, including: (1) spatial variations that randomly change from one location to another on the interface, which can change electrical properties (e.g., carrier mobility or electrical resistance) from one location to another and create random variations from one device (e.g., such as a FET) to another device formed on the substrate; and (2) increase the resistance and thus decrease carrier mobility in the device. This can significantly degrade the device performance.

Figure 2:
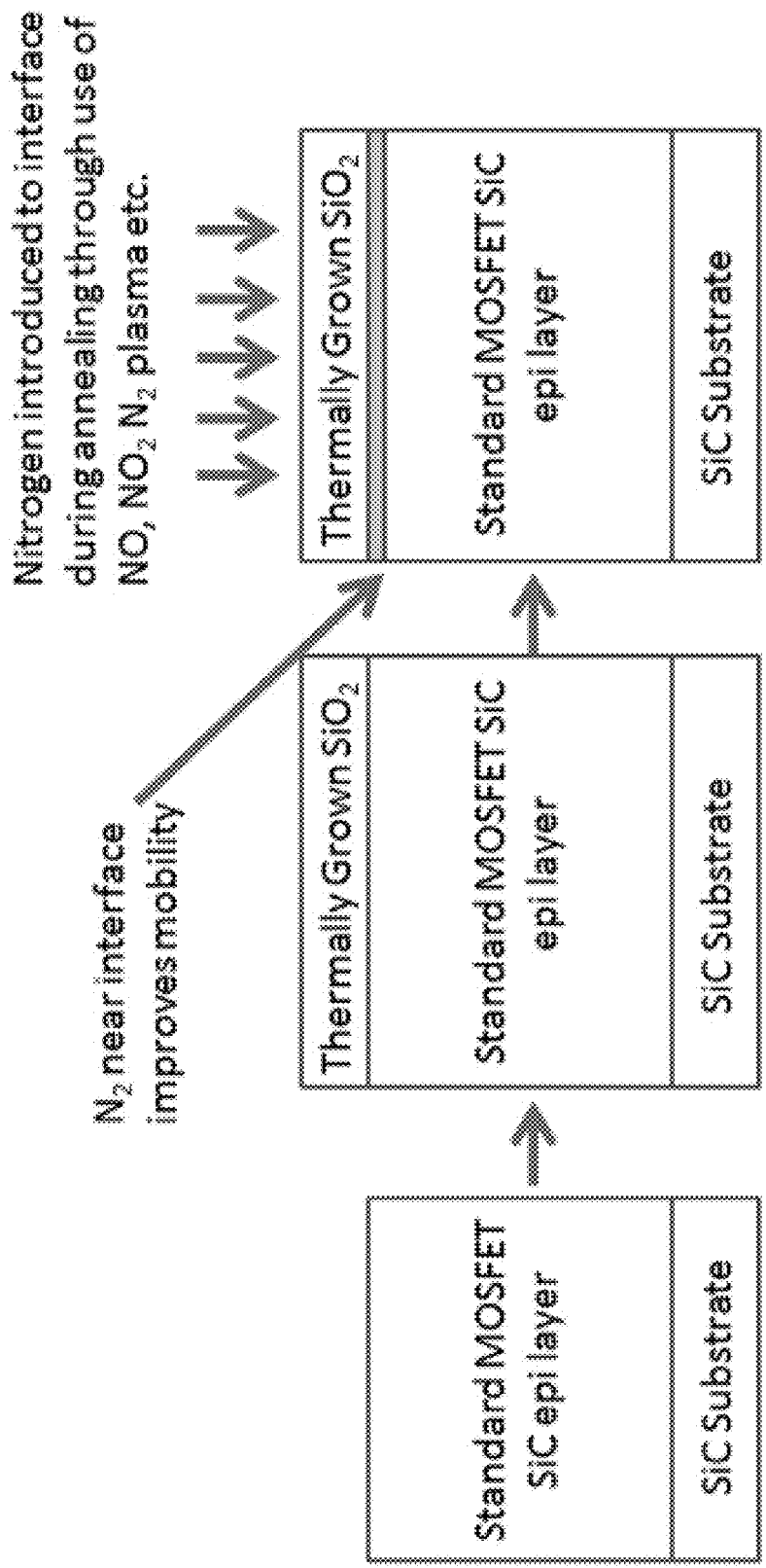
FIG. 2 shows a processing diagram of a device in which nitrogen is introduced at the interface between silicon carbide and a silicon dioxide insulator layer.

FIG. 2 shows a processing diagram of a metal oxide semiconductor field effect transistor (MOSFET) device including a thermally grown SiO$_2$ insulator layer on a SiC epi layer/SiC substrate in which nitrogen is introduced (e.g., by annealing in a nitrogen environment) to interface between the silicon carbide epitaxial layer and outer silicon dioxide insulator layer. For example, annealing the MOSFET device in a N$_2$, NO or N$_2$O environment can passivate the interface defect and thus improve the quality of the SiO$_2$/SiC interface.

The disclosed technology includes a method to incorporate nitrogen at the SiO$_2$/SiC interface through epitaxial growth of a highly nitrogen doped top epitaxial layer. Such an incorporation of nitrogen at the SiO$_2$/SiC interface through growth of a nitrogen doped SiC epitaxial layer can avoid the aforementioned issues associated with the rough interface and do so without the need for post oxidation annealing.

In one aspect, a method for fabricating a silicon carbide semiconductor device includes forming a thin epitaxial layer of a nitrogen doped SiC material on a SiC epitaxial layer formed on a SiC substrate, and thermally growing an oxide layer to form an insulator material on the nitrogen doped SiC epitaxial layer, in which the thermally growing the oxide layer results in at least partially consuming the nitrogen doped SiC epitaxial layer in the oxide layer to produce an interface including nitrogen between the SiC epitaxial layer and the oxide layer.

In some implementations, the insulator material includes silicon oxide. For example, the oxide layer can be grown at a high temperature within a range 900° C. to 1200° C. in an oxidizing environment. For example, the nitrogen doped SiC epitaxial layer can be formed to have a thickness less than 500 nm. For example, the nitrogen doped SiC material can be configured to have a carrier concentration greater than $1\times10^{18}$ cm$^{-3}$. In some implementations, the method can further include forming one or more transistor structures over the insulator material.

Figure 3:
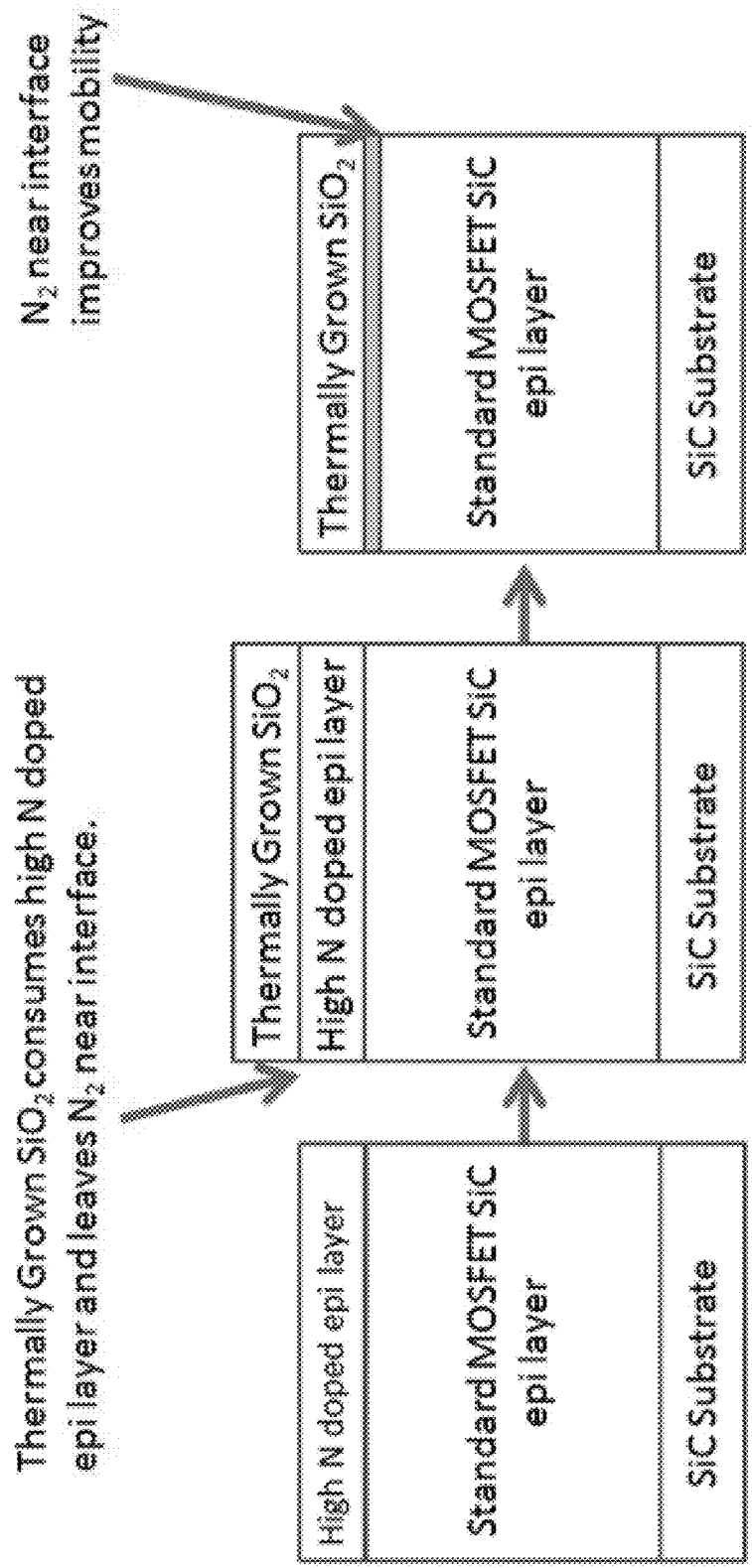
FIG. 3 shows a processing diagram of a method to fabricate a silicon carbide semiconductor device.

For example, the thin epitaxial layer of high nitrogen doped SiC (e.g., >$1\times10^{18}$ cm$^3$) can form a top layer of the field effect transistor's epitaxial stack. For example, standard oxidation of the epitaxial structure will consume at least part of the top most SiC surface (e.g., the heavily nitrogen doped SiC layer) to produce the insulator layer (e.g., SiO$_2$ layer), and this will effectively incorporate nitrogen into the interface, as shown in FIG. 3. FIG. 3 shows a processing diagram of the method to fabricate a SiC semiconductor device including a high N-doped SiC epi layer formed on a silicon carbide substrate and having an nitrogen-containing interface between the SiC epi layer and an outer silicon dioxide insulator layer.

Figure 4:
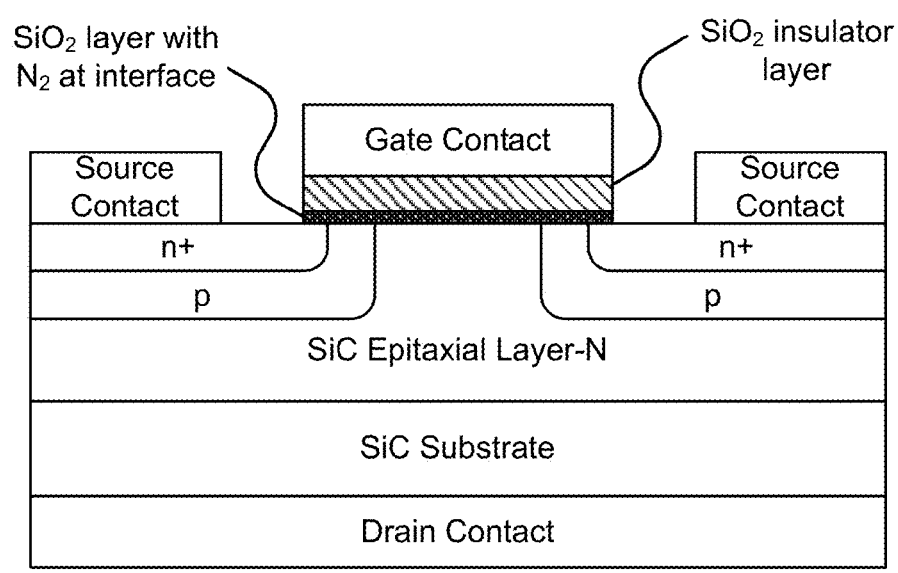
FIG. 4 shows a schematic of an exemplary silicon carbide metal insulator semiconductor field effect transistor device.

Implementations of the fabrication method can produce FET devices with improved performance of structures. FIG. 4 shows a schematic of an exemplary silicon carbide metal insulator semiconductor field effect transistor (MISFET) device that includes an interface including nitrogen between the SiO$_2$ insulator layer and the SiC Epitaxial layer over a SiC substrate.

The device can include a base structure including a SiC substrate configured between a drain contact (e.g., drain electrode) and an SiC epitaxial layer-N. A region of the SiC epitaxial layer-N can be configured to provide a contact surface at the top of the base structure that interfaces with the exemplary insulator layer, e.g., such as silicon dioxide. The insulator layer is formed of an oxide layer on the SiC epitaxial layer-N, in which the exemplary insulator layer includes a interfacial surface that includes nitrogen. The interfacial surface including nitrogen is formed from a thin epitaxial layer of a nitrogen doped SiC material initially formed on the SiC epitaxial layer that is at least partially consumed into the insulator layer during formation (e.g., thermal growth) of the oxide layer. The SiC MISFET device can include a gate contact configured above the insulator layer. The SiC MISFET device can include an n+ layer formed on a p-type well region formed on the SiC epitaxial layer-N. The SiC MISFET device can include source contacts that interface with the n+ layer of the SiC MISFET device.

In some examples of the device, the SiC device can include a SiC substrate, a SiC epitaxial layer formed on the SiC substrate, an oxide layer of an insulator material formed on the SiC epitaxial layer, in which the oxide layer includes a surface layer including nitrogen that forms an interface with the SiC epitaxial layer, and one or more transistor structures over the oxide layer.

Figure 5:
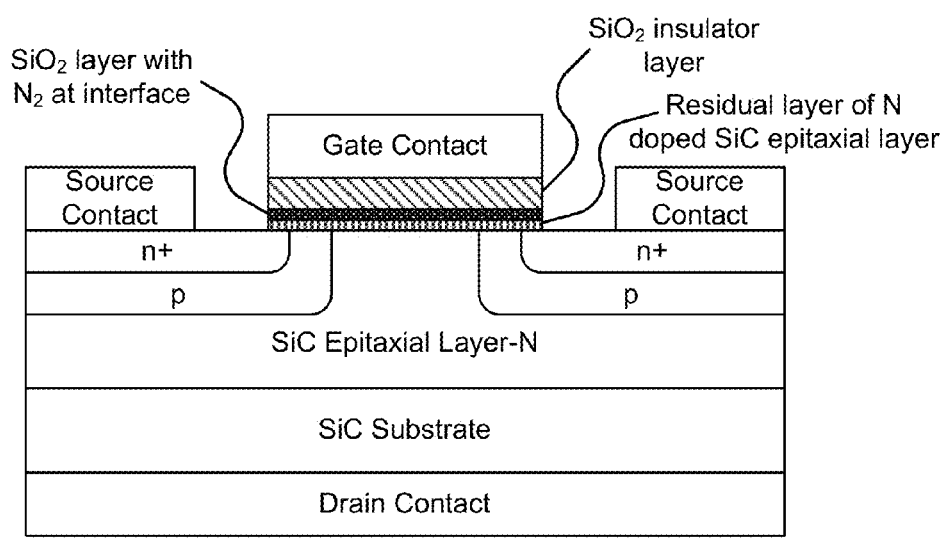
FIG. 5 shows a schematic of an exemplary silicon carbide metal insulator semiconductor field effect transistor device.

In another example of the fabricated FET devices, a SiC device includes a SiC substrate, a SiC epitaxial layer formed on the SiC substrate, an oxide layer of an insulator material formed on the SiC epitaxial layer, in which the oxide layer includes a surface layer including nitrogen that forms an interface with the SiC epitaxial layer, a residual layer formed of a nitrogen doped SiC epitaxial layer between the SiC epitaxial layer and the surface layer of the oxide layer, and one or more transistor structures over the oxide layer. Such an example is shown in FIG. 5.

In some aspects of the disclosed technology, a method for forming a transistor over a SiC substrate includes a process to form a SiC epitaxial layer over a SiC substrate, a process to form a source region and a gate region over the SiC epitaxial layer, a process to form a thin epitaxial layer of a nitrogen doped SiC material on over the gate region over the SiC epitaxial layer, a process to grow an oxide layer to form an insulator material on the nitrogen doped SiC epitaxial layer to form an interface that includes nitrogen between the SiC epitaxial layer and the oxide layer without performing post oxidation gas annealing, e.g., nitridation, annealing in NO, and a process to form a source conductive contact over the source region and a gate conductive contact over the gate region as part of a transistor.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A SiC device, comprising:
   a SiC substrate;
   a first n-type SiC epitaxial layer formed on the SiC substrate;
   a second n-type SiC epitaxial layer comprising nitrogen dopant formed on the first n-type SiC epitaxial layer;
   an oxide insulator material layer disposed over the second n-type SiC epitaxial layer,
   an interface layer disposed in the oxide insulator material layer, the interface layer comprising the nitrogen dopant; and
   one or more transistor structures over the oxide layer,
   wherein the interface layer comprises a spatial variation of nitrogen dopant concentration that decreases in distance from the second n-type SiC epitaxial layer below the interface layer to the oxide insulator material layer above the interface layer.

2. The device as in claim 1, wherein the insulator material includes silicon dioxide.

3. The device as in claim 1, wherein the interface layer comprises at least a portion of the second n-type SiC epitaxial layer material.

4. The device as in claim 1, wherein the second n-type SiC epitaxial layer has a thickness less than 500 nm.

5. The device as in claim 1, wherein the second n-type SiC material has a carrier concentration greater than $1 \times 10^{18}$ $cm^{-3}$.

6. The device of claim 1, wherein the one or more transistor structures includes a gate contact formed over the oxide insulator material layer.

7. The device of claim 1, wherein the SiC substrate is formed over a drain contact.

8. The device of claim 1, wherein the first n-type SiC epitaxial layer includes a first conductivity type region and a second conductivity type region formed over the first conductivity type region.

9. The device of claim 1, wherein the interface layer disposed in the oxide insulator material layer increases carrier mobility in the device as compared with a device without the interface.

10. The device of claim 1, further comprising an n+ layer formed on a p-type well region formed on the first n-type SiC epitaxial layer.

11. A SiC device, comprising:
    a SiC substrate;
    a first n-type SiC epitaxial layer formed on the SiC substrate;
    an oxide layer of an insulator material formed on the first n-type SiC epitaxial layer, the oxide layer including a surface layer including nitrogen dopant that forms an interface with the first n-type SiC epitaxial layer;
    a residual layer formed of a second n-type SiC epitaxial layer between the first n-type SiC epitaxial layer and the surface layer of the oxide layer, wherein the residual layer comprises the nitrogen dopant; and
    one or more transistor structures over the oxide layer,
    wherein the interface layer comprises a spatial variation of nitrogen dopant concentration that decreases in distance from the second n-type SiC epitaxial layer below the interface layer to the oxide insulator material layer above the interface layer.

12. The device as in claim 11, wherein the insulator material includes silicon dioxide.

13. The device as in claim 11, wherein the second n-type SiC epitaxial layer has a thickness less than 500 nm.

14. The device as in claim 11, wherein the second n-type SiC material has a carrier concentration greater than $1 \times 10^{18}$ $cm^{-3}$.

15. The device of claim 11, wherein the one or more transistor structures includes a gate contact formed over the oxide layer.

16. The device of claim 11, wherein the SiC substrate is formed over a drain contact.

17. The device of claim 11, wherein the first n-type SiC epitaxial layer includes a first conductivity type region and a second conductivity type region formed over the first conductivity type region.

18. The device of claim 11, wherein the interface disposed in the oxide insulator material layer increases carrier mobility in the device as compared with a device without the interface.

19. The device of claim 11, further comprising an n+ layer formed on a p-type well region formed on the first n-type SiC epitaxial layer.

* * * * *